United States Patent [19]
Lovejoy et al.

[11] Patent Number: 5,684,308
[45] Date of Patent: Nov. 4, 1997

[54] CMOS-COMPATIBLE INP/INGAAS DIGITAL PHOTORECEIVER

[75] Inventors: Michael L. Lovejoy; Benny H. Rose; David C. Craft, all of Albuquerque, N. Mex.; Paul M. Enquist, Cary; David B. Slater, Jr., Raleigh, both of N.C.

[73] Assignee: Sandia Corporation, Albuquerque, N. Mex.

[21] Appl. No.: 601,904

[22] Filed: Feb. 15, 1996

[51] Int. Cl.$^6$ .............................. H01L 31/0232
[52] U.S. Cl. ................ 257/184; 257/187; 257/197; 257/198; 257/432; 257/458; 257/292
[58] Field of Search .......................... 257/197, 198, 257/184, 458, 432, 187, 292, 291

[56] References Cited

U.S. PATENT DOCUMENTS

| | | | |
|---|---|---|---|
| 5,023,686 | 6/1991 | Helmut et al. | 257/184 X |
| 5,063,426 | 11/1991 | Chandrasekhar | 357/30 |
| 5,115,294 | 5/1992 | Sudbo et al. | 257/187 |
| 5,166,083 | 11/1992 | Bayrautaroglu | 257/197 X |
| 5,170,228 | 12/1992 | Sasaki | 257/184 |
| 5,200,631 | 4/1993 | Austin | 257/81 |
| 5,557,117 | 9/1996 | Matsuoka et al. | 257/184 |

FOREIGN PATENT DOCUMENTS

| | | | |
|---|---|---|---|
| 3101266 | 4/1991 | Japan | 257/184 |
| 4312986 | 11/1992 | Japan | 257/197 |

OTHER PUBLICATIONS

S. Chandrasekhar, J. C. Campbell, A. G. Dentai, C. H. Joyner, G. J. Qua, A. H. Gnauck, and M. D. Feuer, "Integrated InP/GaInAs Heterojunction Bipolar Photoreceiver," *Electronics Letters*, vol. 24, pp. 1443–1445, 10 Nov. 1988.

S. Chandrasekhar, A. G. Dentai, C. H. Joyner, B. C. Johnson, A. H. Gnauck, and G. J. Qua, "4 Gbit/s pin/HBT Monolithic Photoreceiver," *Electronics Letters*, vol. 25, pp. 1880–1882, 25 Oct. 1990.

K. D. Petrotti, R. L. Pierson Jr., R. B. Nubling, C. W. Farley, E. A. Sovero, and M.F. Chang, "Ultra–High–Speed PIN/HBT Monolithic OEIC Photoreceiver," in *Proceedings of the 49th Annual Device Research Conference*, Boulder, CO, pp. VA2–VA3 (IEEE, 1991).

S. Chandrasekhar, L. M. Lunardi, A. H. Gnauck, D. Ritter, R. A. Hamm, M. B. Panish, and G. J. Qua, "A 10 Gbit/s OEIC Photoreceiver Using InP/InGaAs Heterojunction Bipolar Transistors," *Electronics Letters*, vol. 28, pp. 466–468, 27 Feb. 1992.

S. Chandrasekhar, L. M. Lunardi, A. H. Gnauck, R. A. Hamm, and G. J. Qua, "High–Speed Monolithic p–i–n/HBT and HPT/HBT PHotoreceivers Implemented with Simple Transistor Structure," *IEEE Photonics Technology Letters*, vol. 5, pp. 1316–1318, Nov. 1993.

(List continued on next page.)

*Primary Examiner*—William Mintel
*Attorney, Agent, or Firm*—John P. Hohimer

[57] ABSTRACT

A digital photoreceiver is formed monolithically on an InP semiconductor substrate and comprises a p-i-n photodetector formed from a plurality of InP/InGaAs layers deposited by an epitaxial growth process and an adjacent heterojunction bipolar transistor (HBT) amplifier formed from the same InP/InGaAs layers. The photoreceiver amplifier operates in a large-signal mode to convert a detected photocurrent signal into an amplified output capable of directly driving integrated circuits such as CMOS. In combination with an optical transmitter, the photoreceiver may be used to establish a short-range channel of digital optical communications between integrated circuits with applications to multi-chip modules (MCMs). The photoreceiver may also be used with fiber optic coupling for establishing longer-range digital communications (i.e. optical interconnects) between distributed computers or the like. Arrays of digital photoreceivers may be formed on a common substrate for establishing a plurality of channels of digital optical communication, with each photoreceiver being spaced by less than about 1 mm and consuming less than about 20 mW of power, and preferably less than about 10 mW. Such photoreceiver arrays are useful for transferring huge amounts of digital data between integrated circuits at bit rates of up to about 1000 Mb/s or more.

48 Claims, 3 Drawing Sheets

OTHER PUBLICATIONS

E. Sano, M. Yoneyama, H. Nakajima, and Y. Matsuoka, "A Monolithically Integrated Photoreceiver Compatible with InP/InGaAs HBT Fabrication Process," *IEEE Journal of Lightwave Technology*, vol. 12, pp. 638–643, Apr. 1994.

S. Chandrasekhar, L. M. Lunardi, R. A. Hamm, and G. J. Qua, "Eight–Channel p–i–n/HBT Monolithic Photoreceiver Array at 2.5 Gb/s per Channel for WDM Applications," *IEEE Photonics Technology Letters*, vol. 6, pp. 1216–1218, Oct. 1994.

M. L. Lovejoy, B. H. Rose, R. F. Carson, P. E. Enquist, and D. B. Slater Jr., "Low–Power High–Speed InGaAs/InP Photoreceivers for Highly Parallel Optical Data Links," presented at the 1995 Workshop on Compound Semiconductor Materials and Devices, New Orleans, LA, Feb. 19–22, 1995.

G. A. Patrizi, M. L. Lovejoy, R. J. Shul, R. P. Schneider Jr., D. J. Rieger, B. H. Rose, and P. M. Enquist, "Wet–Dry Etch Development for Low–Power InGaAs/InP Photoreceiver Fabrication," presented at the 31st Annual Symposium of the New Mexico Chapter of the American Vacuum Society, Albuquerque, NM, Apr. 10–14, 1995.

R. F. Carson, M. L. Lovejoy, K. L. Lear, M. E. Warren, O. Blum, S. P. Kilcoyne, T. Du, P. K. Seigal, D. C. Craft, and B. H. Rose, "Low–Power, Parallel Photonic Interconnections for Multi–Chip Module Applications," presented at the 45th Electronic Components and Technology Conference, Las Vegas, NV, May 21, 1995.

M. L. Lovejoy, G. A. Patrizi, P. M. Enquist, B. H. Rose, D. B. Slater Jr., R. J. Shul, R. F. Carson, D. C. Craft, D. J. Rieger, and J. A. Hutchby, "Low–Power, High–Speed InGaAs/InP Photoreceiver for Highly Parallel Optical Data Links," in *Technical Digest of the 1995 IEEE GaAs IC Symposium*, pp. 181–184, 29 Oct. 1995.

CMOS-COMPATIBLE INP/INGAAS DIGITAL PHOTORECEIVER

This invention was made with Government support under Contract No. DE-AC04-94AL85000 awarded by the U.S. Department of Energy. The Government has certain rights in the invention.

FIELD OF THE INVENTION

The present invention relates generally to optical communications, and in particular to a monolithic InP/InGaAs digital photoreceiver which provides an amplified output signal at a level that is sufficient for directly driving integrated circuitry including CMOS circuitry.

BACKGROUND OF THE INVENTION

The rapid development of optical communications has led to a need for low-cost, high-speed photoreceivers. In the prior art, analog photoreceivers have been formed by integrating a photodetector and an analog amplifier on a common substrate. In particular, the monolithic integration of a p-i-n photodetector and a heterojunction bipolar transistor (HBT) analog amplifier simplified device processing while providing for ultra-high-speed analog operation (up to a few GHz or more) of the photoreceiver. In the prior art, such monolithic analog photoreceivers have been designed primarily for driving of low-impedance (i.e. 50 Ω) loads at non-saturated output signal levels of about 100 mV. If such low-level analog output signals are used for driving digital circuitry, a decision circuit or the like must be used to determine whether a particular signal level represents a "low" logic state or a "high" logic state; and furthermore, a clock recovery circuit is generally required. (See, for example, K. D. Pedrotti, et al. in Proceedings of the 49th Annual Device Research Conference, pp. A2–A3, 1991; S. Chandrasekhar et al. in IEEE Photonics Technology Letters, vol. 5, pp. 1316–1318, November 1993; and E. Sano et al. in IEEE Journal of Lightwave Technology, vol. 12, pp. 638–643, April 1994; and U.S. Pat. No. 5,063,426 to S. Chandrasekhar et al.)

A primary emphasis in the prior art has been to form single-channel photoreceivers for optical fiber communications applications. More recently, one-dimensional (1-D) arrays of photoreceivers have been demonstrated with edge-illuminated p-i-n photodetectors (see S. Chandrasekhar et al., IEEE Photonics Technology Letters, vol. 6, pages 1216–1218, October 1994). These 1-D photoreceiver arrays have applications for wavelength-division-multiplexed optical communications, with each photodetector mating to either a ribbon fiber connector or a guided-wave multiplexer/demultiplexer device.

A problem that has not been addressed heretofore with p-i-n/HBT photoreceivers is free-space digital optical data communication within a distributed system comprising a plurality of interconnected digital integrated circuits (e.g. CMOS) for applications such as distributed computing, signal processing, image correlation processing (e.g. pattern recognition), mass memory access, display technology or the like. Such a distributed system based, for example, on multi-chip-module (MCM) technology formed with complementary metal-oxide semiconductor (CMOS) integrated circuits (ICs) requires that huge volumes of data be rapidly and accurately transferred between a plurality of ICs or computer chips in order to perform real-time distributed data processing.

The use of electrical interconnections for data transfer between a plurality of chip levels (e.g. within stacked MCMs) becomes more difficult as the IC chip count, clock rate and number of inputs and outputs per IC chip increase. Thus, an optical data transfer may be preferred to provide an increased immunity to electromagnetic interference, an increased electrical isolation, a higher reliability (due to few if any electrical interconnections between superposed chips), and reduced signal delays (which for electrical interconnections arise from a combination of resistance, capacitance and inductance). However, optical data communications based on gigabit/s data links as used in prior-art fiber optical communication technology has disadvantages since the data must be multiplexed and demultiplexed to fully utilize this wide bandwidth which generally greatly exceeds an operating speed of present ICs (less than about 200 MHz). Furthermore, multiplexing and demultiplexing the data requires additional complicated circuitry interconnected to a transmitter and a photoreceiver, requiring additional space and power requirements and generating added time delays and an increased possibility for data corruption (i.e. a loss of data fidelity). Finally, even without multiplexing and demultiplexing, the low output signal levels (about 100 mV) from photoreceivers having non-saturated (i.e. analog) amplifiers as generally taught by the prior art (see, for example, U.S. Pat. No. 5,063,426 to Chandrasekhar et al) requires the use of additional circuitry in the form of line drivers, buffers, level shifters or the like for interfacing the photoreceiver output signal to digital integrated circuits.

A high-speed optical interconnect MCM packaging scheme has been disclosed by Austin et al in U.S. Pat. No. 5,200,631. This patent recognizes the need for a plurality of channels of optical communication between superposed chips in the MCM package, with each channel of communication comprising at least one pair of superposed optical transmitters (e.g. vertical-cavity surface-emitting lasers or light-emitting diodes) and photoreceivers. However, the patent of Austin et al describes photoreceivers in general terms only, with many different possibilities being presented including junction diodes, PIN diodes, Schottky barrier diodes, GaAs metal-semiconductor-metal diodes, heterojunction diodes, photoconductors and phototransistors with no recognition of a preferred photodetector. Furthermore, the patent of Austin et al does not suggest or teach any photoreceiver design for optimizing performance for efficient and high-fidelity data transfer, or for reducing power consumption.

An advantage of the InP/InGaAs digital photoreceiver of the present invention is that the photoreceiver has a simple epitaxial semiconductor layer structure with common layers being used for formation of a p-i-n photodetector and an adjacent heterojunction-bipolar transistor amplifier.

Another advantage of the present invention is that the digital photoreceiver has been designed to provide for a very low power consumption down to about 10 mW or less for each channel of digital optical communication, thereby allowing a plurality of spaced photoreceivers to be fabricated monolithically on a common substrate in the form of an array.

Another advantage of the present invention is that the digital photoreceiver may be operated with a single CMOS power supply used for powering CMOS circuitry to which the photoreceiver may be electrically connected.

A further advantage is that, in response to an incident light beam, the digital photoreceiver of the present invention provides an output signal that is sufficiently large to directly drive CMOS circuitry (or other digital integrated circuits), thereby eliminating the need for any further amplification, buffers, line drivers, level shifters or the like for interfacing with the circuitry.

Yet another advantage of the present invention is that, by operating an amplifier of the monolithic photoreceiver in a saturated switching mode of operation (including a "soft" saturated mode wherein a Schottky clamp is provided between a base and a collector of a pull-down transistor in an output stage of the amplifier), a signal-to-noise ratio of an amplified output signal of the photoreceiver is improved, thereby providing for data transfer at a very low bit error rate.

These and other advantages of the CMOS-compatible InP/InGaAs digital photoreceiver of the present invention will become evident to those skilled in the art.

SUMMARY OF THE INVENTION

Accordingly, it is a primary object of the present invention to provide one or more channels of substantially error-free optical communication of digital data between a plurality of integrated circuits.

An additional object of the present invention is to provide a monolithic InP/InGaAs digital photoreceiver having an output signal level sufficient for directly driving integrated circuitry.

A further object of the present invention is to provide an InP/InGaAs digital photoreceiver that operates at a speed or clock rate of an integrated circuit to which it is electrically connected thereby providing for direct and accurate data transfer between a plurality of integrated circuits at the clock rate.

Yet another object of the present invention is to provide an InP/InGaAs digital photoreceiver that operates from a single power supply used for powering the integrated circuitry, thereby eliminating a need for any additional power supplies for powering the photodetector or for biasing a photodetector therein.

Still another object of the present invention is to provide an InP/InGaAs digital photoreceiver usable with an incident light beam having a wavelength within the range of about 0.95–1.6 μm.

Another object of the present invention is to provide an InP/InGaAs digital photoreceiver having a low power consumption of about 10–20 mW or less.

Yet a further object of the present invention is to form a 2-dimensional (2-D) array of spaced low-power photoreceivers on a common substrate for establishing a plurality of channels of digital optical communication between integrated circuits, distributed computers, signal processors or the like.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a monolithic CMOS-compatible InP/InGaAs digital photoreceiver is provided. The digital photoreceiver comprises an InP substrate having a plurality of InP/InGaAs semiconductor layers grown thereon; a p-i-n photodetector formed within the plurality of semiconductor layers and having a CMOS-compatible voltage applied thereto for detecting an incident light beam and generating an electrical signal therefrom; and a heterojunction bipolar transistor (HBT) amplifier formed within the plurality of semiconductor layers and powered by the CMOS-compatible voltage for receiving the electrical signal and generating therefrom an amplified output signal sufficient for directly driving CMOS circuitry. Some preferred embodiments of the present invention may include a focusing lens formed below the InP substrate for focusing the incident light through the substrate and into the photodetector. Furthermore, a plurality of spaced photoreceivers may be provided in the form of an array on a common substrate for detecting a plurality of light beams and thereby forming a plurality of channels of optical communication for high-bit-rate digital data transfer.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
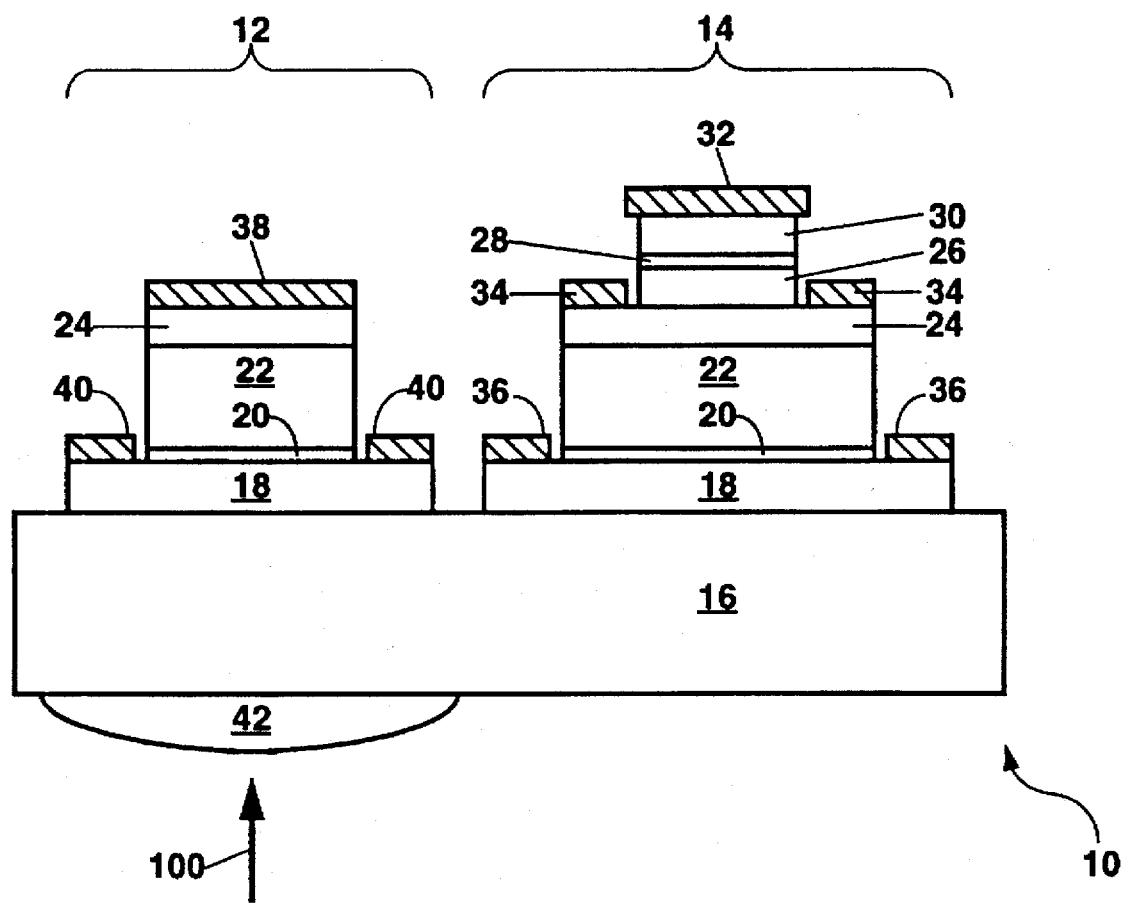
FIG. 1 shows a partial cross-sectional view of an example of an InP/InGaAs digital photoreceiver according to the present invention, with the photoreceiver comprising at least one photodetector (12), and a plurality of heterojunction bipolar transistors (14) forming a saturated amplifier electrically connected to the photoreceiver.

Referring to FIG. 1, there is shown a partial cross-sectional view of an example of an InP/InGaAs digital photoreceiver 10 according to the present invention, with the photoreceiver comprising a p-i-n photodetector 12 and a plurality of heterojunction bipolar transistors (HBTs) 14 forming a saturated amplifier electrically connected to the photoreceiver. The photoreceiver 10 is fabricated from a plurality of InP/InGaAs semiconductor layers epitaxially grown (by MBE, MOCVD or the like) on an InP substrate 16, with the p-i-n photodetector 12 preferably being formed from common layers used for forming the HBTs 14 to simplify device fabrication. The use of HBTs in the photoreceiver amplifier provides a low impedance electrical connection to the photodetector as compared with other types of transistors such as field-effect transistors (FETs). This low impedance connection produces a rapid discharge of any electrical photocurrent produced within the p-i-n photodetector, thereby improving a response time or speed of the photodetector and reducing a time constant therein. HBTs also provide a large frequency bandwidth for the photoreceiver amplifier to accurately replicate digital data provided optically to the photoreceiver. (Digital data as defined herein may also include a clock signal.)

In FIG. 1, the InP substrate preferably comprises semi-insulating InP (e.g. Fe-doped). If the photoreceiver 10 is to be used with substrate-side illumination at a wavelengths less than about 1 μm, then absorption within the substrate (e.g. due to Fe doping) should preferably be minimized either by preselecting substrates for a low absorption at a particular wavelength, by reducing an impurity dopant (e.g. Fe) concentration therein, or by reducing the thickness of the substrates by thinning before or after fabrication of one or more photoreceivers thereon.

In the example of FIG. 1, a plurality of InP/InGaAs layers are epitaxially grown on the InP substrate 16 preferably including a sub-collector layer 18, a transition layer 20, a collector layer 22, a base layer 24, an emitter layer 26, a sub-cap layer 28, and an cap layer 30. A semiconductor alloy composition of the InGaAs layers (e.g. $In_{0.53}Ga_{0.47}As$) is preferably selected for lattice matching to the InP substrate.

The sub-collector layer 18 preferably comprises heavily-doped (e.g. n-type doped to about $2\times10^{19}$ $cm^{-3}$ with sulfur) InP with a layer thickness of about 300 nm. InP is preferred for the sub-collector layer 18 since it is substantially non-absorbing to an incident light beam 100 propagated through the substrate to an absorbing region (e.g. layer 22) within the photodetector 12.

The transition layer 20 is preferably provided to move a conduction band-edge spike of the HBTs into a quasi-neutral region and thereby improving a carrier collection efficiency within the HBTs. The transition layer 20 preferably comprises heavily-doped (e.g. n-type doped to about $1.5\times10^{19}$ $cm^{-3}$ with sulfur) InGaAs with a layer thickness of about 10 nm.

The collector layer 22 preferably comprises either intrinsic (i.e. not intentionally doped) or lightly-doped InGaAs (e.g. with about $6\times10^{15}$ $cm^{-3}$ n-type doping), and is primarily responsible for absorption of a light beam 100 incident on the photodetector and generation of an electrical photocurrent signal therein. The thickness of the collector layer 22 is preferably about 0.8 μm or more to provide a high responsivity (up to 0.4 A/W or higher) for the photodetector over a wavelength range from about 0.95 μm to about 1.3 μm or longer. In predetermining a layer thickness for the collector layer, a compromise must generally be made between a speed of the HBTs which is reduced by increasing the layer thickness and the responsivity of the photodetector which is increased by increasing the layer thickness.

In the example of FIG. 1, base layer 24 preferably comprises heavily-doped (e.g. p-type doped to about $1\times10^{19}$ $cm^{-3}$ with zinc) InGaAs with a layer thickness of about 100 nm. The base layer 24 is used for forming a base for the HBTs and also for forming a p-side of the p-i-n photodetector 12.

Emitter layer 26 for forming an emitter of the HBTs preferably comprises lightly-doped (e.g. n-type doped to about $5\times10^{17}$ $cm^{-3}$ with sulfur) InP with a layer thickness of about 100 nm. Between the base and emitter layers (24 and 26, respectively), a thin (10 nm thick) undoped (i.e. not intentionally doped) spacer or setback layer comprising InGaAs is preferably provided for separating the base and emitter layers and for smoothing any band discontinuities therebetween.

In the example of FIG. 1, a heavily-doped sub-cap layer 28 and a heavily-doped cap layer 30 are provided for contacting the emitter of the HBTs. The sub-cap layer 28 is preferably InP with an n-type doping of about $2\times10^{19}$ $cm^{-3}$ and a layer thickness of about 50 nm; whereas the cap layer 30 preferably comprises InGaAs with an n-type doping of about $1.5\times10^{19}$ $cm^{-3}$ and a layer thickness of about 30–120 nm.

The p-i-n photodetector and adjacent HBTs are fabricated monolithically by utilizing the base, collector, transition and sub-collector layers (18, 20, 22 and 24, respectively) for forming a semiconductor p-i-n junction of the photodetector 12. (Although the present invention is described in terms of a p-i-n photodetector 12, it will be recognized by those skilled in the art that other types of photodetectors may be substituted for the p-i-n photodetector, and in particular metal-semiconductor-metal photodetectors also termed MSM photodetectors.)

The HBTs in the example of FIG. 1 were fabricated with lateral emitter dimensions of 2.6 μm×5.2 μm for an input switching transistor (14a in FIG. 2) and with lateral emitter dimensions of 2.6 μm×10.4 μm for output switching transistors (14b and 14c in FIG. 2) forming the digital amplifier of the photoreceiver. The HBTs provide a current gain of up to about 120 or higher, with an $f_T$ of about 50 GHz and an $f_{max}$ of about 50–60 GHz. Since the HBTs in the photoreceiver are operated in a large signal mode, the high current gain is preferred and wide bandwidth are useful to provide fast rise and fall times of about 1 ns for replicating digital data provided by the incident light beam to directly driving CMOS circuitry (or other integrated circuitry) to which the photoreceiver is connected.

Figure 2:
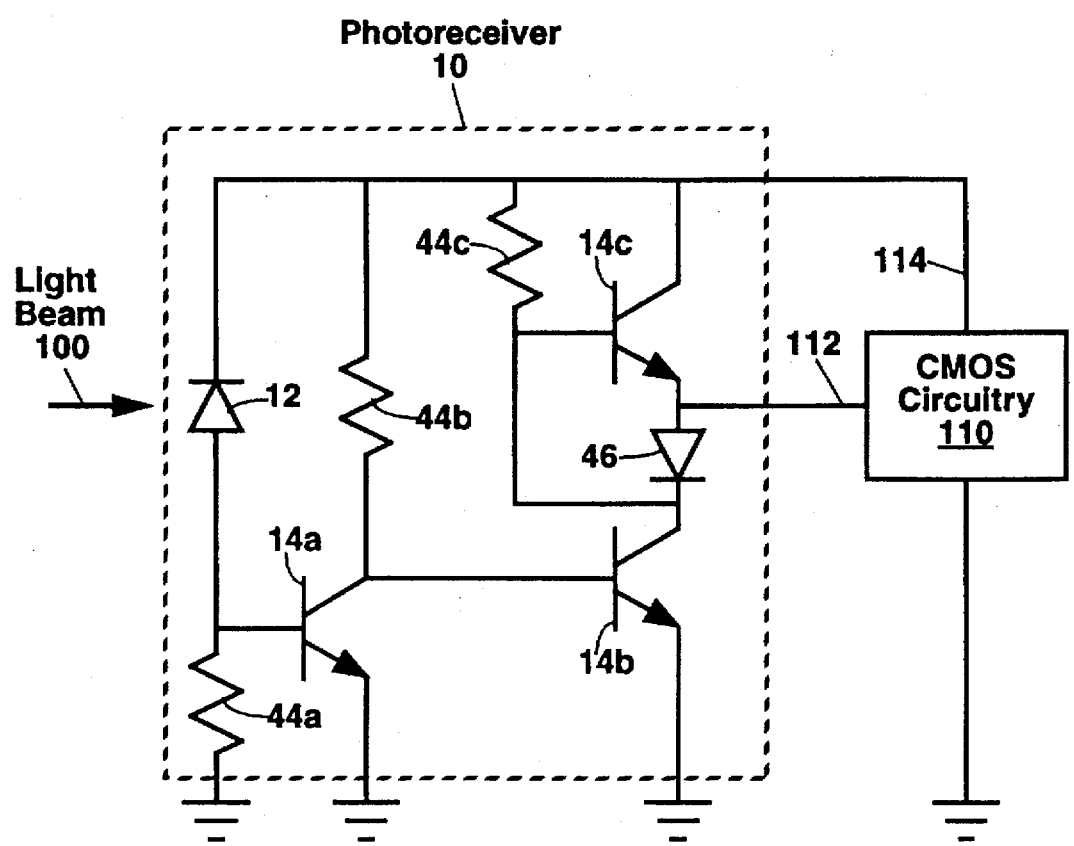
FIG. 2 shows an electrical schematic diagram of an example of the InP/InGaAs digital photoreceiver formed according to the present invention for directly driving CMOS circuitry and receiving electrical power therefrom.

In the example of FIG. 1, each p-i-n photodetector 12 and each HBT 14 are preferably fabricated by a combination dry and wet etching process as described hereinafter. (An electrical diode 46 shown in the amplifier circuit of FIG. 2 is also formed in a manner similar to that described herein for the p-i-n photodetector, except for smaller lateral dimensions for the diode 46.) Initially, for forming each HBT 14 an emitter contact electrode 32 is formed, for example, by electron-beam deposition of titanium-platinum-gold (Ti/Pt/Au) without an annealing step; and the emitter electrode is then patterned by a lift-off process. The emitter electrode may be used as an etching mask for defining an underlying emitter portion of a transistor mesa by a dry etching process such as reactive ion etching (RIE) in a methane-based plasma. The RIE process is preferred since it is highly anisotropic and provides essentially vertical sidewalls for the emitter portion of the transistor mesa. After dry etching, the InGaAs cap layer 30 is preferably slightly undercut (i.e. etched laterally inward underneath electrode 32) with a wet InGaAs-specific etchant such as a 5:1:50 solution of phosphoric acid:hydrogen peroxide:de-ionized water. (To minimize any preferential etching along crystalline planes, a rectangular emitter electrode 32 is preferably oriented at an angle of about 45° with respect to major crystalline cleavage planes of the InP substrate 16; whereas no preferential orientation is required when the emitter electrode is circular.)

To expose the base layer 24 for contacting thereof, a wet InP-specific etchant such as a 4:1 solution of phosphoric acid:hydrochloric acid is used to etch downward through any remaining portion the InP emitter layer 26 outside the emitter electrode and expose the InGaAs base layer 24. This InP-specific etchant also advantageously undercuts the emitter layer 26 slightly as shown in FIG. 1 so that a self-aligned Ti/Pt/Au base contact electrode 34 may be deposited without electrically contacting with the emitter layer 26. Prior to deposition of the base electrode 34, the InGaAs base layer 24 is preferably etched by a quick dip (e.g. a few seconds) into the InGaAs-specific wet etchant to remove up to about 5 nm of material and thereby improve the electrical contact with base electrode 34. This etch step may also serve to remove any remaining portion of the setback layer (not shown).

In FIG. 1, a base portion of the transistor mesa is then preferably defined by standard positive-tone photolithography and etching with the dry methane-based plasma etch process described heretofore. After this dry etch step, the wet InGaAs-specific etchant is preferably used for etching downward to the InP sub-collector layer. A collector portion of the transistor mesa may then be formed by etching the exposed InP sub-collector layer 18 with the InP-specific wet etchant. Ti/Pt/Au is then deposited and patterned by lift-off for forming an annular collector electrode 36. For improved contact of the emitter electrode with an interconnect metallization, the collector portion of the transistor mesa may be sloped during wet etching with the InP-specific etchant.

A stepped photodetector mesa is also preferably formed during etching of the corresponding HBT layers, with unannealed Ti/Pt/Au p-side and n-side photodetector electrodes (38 and 40, respectively) being deposited in the same steps as the adjacent HBT electrodes (i.e. electrodes 34 and 38 are formed in the same deposition step; and electrodes 36 and 40 are formed in the same deposition step). A size and shape of the photodetector mesa may be predetermined depending upon a size and shape of the incident light beam 100 and whether or not a focusing lens 42 is to be provided below the substrate 16. In the example of FIG. 1, the photodetector mesa may be circular or square in shape with a lateral dimension (as measured across layer 22) that is about 50 µm. The stepped photodetector mesa allows formation of an annular n-side electrode 40 and a patterned (e.g. annular or fingered) or full-surface p-side electrode 38. A full-surface p-side electrode 38 may be preferred for an incident light beam transmitted through the substrate as shown in FIG. 1 so that the electrode 38 may act as a reflecting mirror for redirecting any unabsorbed portion of an incident light beam 100 back into the collector layer 22 to increase a detection efficiency of the photodetector. For other embodiments of the present invention an annular or fingered p-side electrode may be preferred so that an incident light beam may be received from a top-side of the photoreceiver (or alternately for bi-directional communication with light beams being directed into the photoreceiver from either the top side or the substrate side, or both).

Etching down to the semi-insulating InP substrate 16 during formation of the collector portion of the transistor mesa and an n-side portion of the photodetector mesa electrically isolates the photodetector 12 and HBTs 14. Thin-film resistors (44a, 44b and 44c in FIG. 2) comprising either nickel/chromium or tantalum nitride are then preferably formed on the substrate. Nickel/chromium thin-film resistors may be formed by photolithographic patterning, deposition and lift-off steps; whereas tantalum nitride thin-film resistors are preferably formed by a blanket deposition process with patterning by a dry etching step. Finally, an interconnect metallization (e.g. a multi-level metallization comprising about 6 µm wide×0.5 µm thick deposited gold) is deposited and patterned to electrically connect the various elements forming the photoreceiver circuit of FIG. 2 and to provide a plurality of bond pads for external connections. A dielectric material (e.g. benzocyclobutene polymer or the like) may be used to planarize the photoreceiver for isolation of different levels of the interconnect metallization and to provide environmental protection. Via holes may be etched through the dielectric material for providing electrical connections to the various interconnect metallization levels and to the HBTs, photodetector, and thin-film resistors.

After formation of the p-i-n photodetector and HBTs on a top-side (i.e. an epitaxial side) of the substrate, a lens 42 may be formed on the lower surface (i.e. a substrate side) of the substrate centered about a central optical axis of the photo-detector for focusing the incident light beam 100 through the substrate and into absorbing layer 22 of the photodetector. Such a lens 42 may be either a refractive lens (with or without an anti-reflection coating applied thereon) or a diffractive (i.e. binary) lens formed by methods well-known to the art. The use of a lens is advantageous for increasing a detection efficiency of the incident light beam, especially when the beam is provided by a divergent optical source such as a light-emitting diode (LED) or a vertical-cavity surface-emitting laser (VCSEL).

After fabrication, the photoreceiver 10 in chip form may be attached to a submount or the like for providing electrical connections to the photoreceiver and for aligning the photoreceiver chip with one or more incident light beams 100. (In some cases, the submount may be an integrated circuit.) The use of a submount (e.g. silicon) is to be preferred, especially for aligning arrays of photoreceivers 10 to superposed optical transmitters (or optical fibers) for establishing a plurality of channels of optical communication for data transfer (e.g. as in a MCM, an optical computer, a multi-channel optical interconnect or the like). The photoreceiver chip may be provided with a plurality of solder bumps or the like for alignment to the submount; and the submount may further include a plurality of alignment features (e.g. etched grooves, trenches, holes or the like) as known to the art for alignment of the photodetector to one or more optical transmitters (or optical fibers). If the incident light beams are to be transmitted through the submount to the photodetector, a through-hole may be provided in the submount at the location of the central optical axis of each photodetector; or alternately one or more wavelengths for the incident light beams may be selected for which the substrate is substantially transparent (e.g. wavelengths greater than about 1.1 µm for a silicon submount). (Anti-reflection coatings may be applied to surfaces of a transparent submount if necessary to further reduce a transmission loss of the submount.)

FIG. 2 shows an electrical schematic diagram of an example of the InP/InGaAs digital photoreceiver formed according to the present invention for directly driving CMOS circuitry (or other integrated circuitry) and receiving power therefrom. To form a low-power-consumption circuit as shown in FIG. 2 that is preferably non-inverting so that a digital optical signal may be accurately replicated, several circuit topologies were numerically modeled and evaluated for amplified output signal level, pulse response time and delays, and overall power consumption. Among the circuit topologies investigated were cascode circuits with transistors connected in common base and common emitter configurations. However, these cascode circuits were eliminated from consideration since these circuits operated in a small signal mode and were unable to provide a power consumption on the order of 10 mW or less for the entire photoreceiver. (A lower power consumption down to about 2–3 mW may be possible in other embodiments of the present invention wherein the ~1 ns rise and fall time specifications for the amplified output signal are relaxed.)

In all circuit simulations, a 4 pF load was used to simulate the load of a single input gate of a typical 3.3 volt CMOS gate application-specific integrated circuit (ASIC). Simulations of the amplifier circuit in FIG. 2 show that this ciruit may be used to drive capacitive loads up to about 16 pF, thereby allowing the photoreceiver to be used in a fan-out mode to simultaneously drive a plurality of input gates to CMOS circuitry. Other digital amplifier circuit designs may be formed according to the present invention for direct connection to other types of integrated circuits that operate at different voltage levels and that have different input impedances (e.g. 50 Ω).

In FIG. 2, a low input impedance for HBT 14a simplifies the design of the amplifier for high-speed operation; and a high-current drive capability of the HBTs makes large voltage swings possible. In the example of FIG. 2, circuit simplicity was chosen at the expense of a slightly higher power consumption thereby permitting easier fabrication of the HBT amplifier, and increasing a device yield for forming large arrays of photoreceivers (e.g. with a lateral spacing of about 500 μm with scalability to about 250 μm). The photoreceiver circuit in FIG. 2 comprises a high-transimpedance (up to about 20,000 Ω) amplifier with the HBTs operating in a large-signal or saturated mode (also termed a switching mode) with a low-power consumption of about 10–20 mW and operating from a single power supply that may be derived, for example, from an interconnection to an integrated circuit (e.g. CMOS circuitry 110 as shown in FIG. 2) or to an IC power bus. The photoreceiver circuit provides a CMOS-compatible amplified output signal for an incident light beam having an optical power level of about 0.25 mW/pulse or higher (and producing an electrical photocurrent signal of about 0.1 mA or more in the p-i-n photodetector). In the digital photoreceiver amplifier, the relatively large photocurrent signal (i.e. large compared with transistor base noise currents and resistor thermal noise currents) and a nonlinear circuit response due to the switching mode of operation provides a high signal-to-noise ratio to enhance data fidelity.

In the example of FIG. 2, the p-i-n photodetector 12 is reverse-biased at a CMOS power supply voltage provided by a first electrical connection 114 to the CMOS circuitry 110 (or alternately to a common supply that powers the CMOS circuitry and the photoreceiver at a supply voltage, $V_{cc}$) and a second electrical connection to ground through a first resistor 44a, with the electrical photocurrent signal from the photodetector being provided to the base of a first HBT 14a for biasing thereof. The first HBT 14a is preferably operated in a large-signal mode (with or without a saturation thereof) to provide an amplified intermediate signal that is fed to the base of a second HBT 14b in an output stage of the amplifier (comprising HBTs 14b and 14c). HBT 14b is used as a pull-down transistor which in combination with HBT 14c operates in a switching mode to provide an amplified output signal that accurately replicates a digital data stream provided to an optical transmitter for generating the light beam 100 incident on the photoreceiver. In the example of FIG. 2, HBTs 14b and 14c are operated in saturation. However, for other embodiments of the present invention, pull-down transistor 14b may be operated in a "soft" saturating switching mode wherein a Schottky diode is monolithically formed on the substrate and electrically connected between a base and a collector of HBT 14b to increase a speed of operation of the photoreceiver.

When light is absent from the p-i-n photodetector 12 (i.e. for a low light power level in incident light beam 100), the first HBT 14a is in an "off" state, allowing the second HBT 14b to be switched to an "on" state by a current flow through a second resistor 44b. In this state, a diode 46 (preferably formed monolithically from layers 18, 20, 22 and 24 during formation of the HBTs and photodetector) is forward biased; and a capacitive load (~4 pF) provided by the CMOS circuitry at an input connection 112 thereto is rapidly discharged to a "low" state through diode 46 and HBT 14b, thereby providing a "low" output signal from the photoreceiver for use as a "low" logic state input to the CMOS circuitry at a voltage level determined by a saturated collector-to-emitter voltage of HBT 14b plus a voltage drop across diode 46. (For a purely capacitive load, the voltage drop across diode 46 is small due to a low current flow therein so that the "low" logic state input to the CMOS circuitry is about the saturated voltage of HBT 14b which may be in the range of about 0.5–0.7 volts.)

In FIG. 2, a primary function of diode 46 is to limit current flow through a third HBT 14c when the second HBT 14b is switched on. With the base of the third HBT 14c connected to a low side of diode 46 as shown in FIG. 2, a base-emitter junction of HBT 14c is reverse-biased at the voltage drop across diode 46 when the second HBT 14b is switched "on". This reverse biasing of HBT 14c then limits a collector-to-emitter current flow through HBT 14c when a "low" logic signal is provided to the CMOS circuitry 110 (or other integrated circuitry), thereby minimizing power consumption within HBT 14c, diode 46 and HBT 14b. (In other embodiments of the present invention, HBTs 14b and 14c may be provided as a pair of complementary HBTs to further limit power consumption within the output stage of the photoreceiver.)

When sufficient light (e.g. about 0.25 mW or more at about 980 nm) is present on the p-i-n photodetector 12, the generated photocurrent switches the first HBT 14a to an "on" state thereby substantially reducing the current flow through resistor 44b to the second HBT 14b and switching the second HBT to an "off" state. The third HBT 14c is then biased to an "on" state by a third resistor 44c providing a "high" amplified output signal from the photoreceiver for use as a "high" logic state input to the CMOS circuitry 110 to charge the capacitive load therein.

In the circuit of FIG. 2, resistor 44a is provided to aid in rapidly removing any charge remaining at the input to the first HBT 14a after a "high" to "low" logic level transition of the incident light beam 100, thereby reducing a response time of the photoreceiver (which is primarily limited by the p-i-n photodetector response time due to a junction capacitance therein of about 0.25 pF).

Resistance values for the resistors 44a, 44b and 44c were optimized from computer modeling simulations to provide both a low power consumption and a high switching speed for the photoreceiver circuit. Preferred resistance values in the example of FIG. 2 are about 10kΩ, 3kΩ and 2kΩ for resistors 44a, 44b and 44c, respectively. With these resistance values, circuit simulation showed an average power consumption of about 8 mW for a worst-case condition when the optical data stream consists of a continuous train of alternating "high" and "low" logic states in the form of a square wave. (Actual fabricated photoreceivers with slightly different resistance values provided an average power consumption of about 12 mW under this worst-case condition.) For the photoreceiver circuit of FIG. 2, the power consumption is primarily determined by a quiescent current flow through the resistors 44a, 44b and 44c since the HBTs are operated in a switching mode. (For comparison, the average power consumption due to charging of a 4 pF capacitive load, $C_{load}$, within the CMOS circuitry at a data bit rate, f, of 100 MHz and a voltage swing, V, of 2 volts between "high" and "low" logic states is $fC_{load}V^2 = 1.6$ mW.) In order to further reduce the average power consumption of the photoreceiver circuit several modifications to the present invention may be made, including use of a preferred data format such as non-return to zero (NRZ); providing the photoreceiver amplifier with a complimentary output stage (comprising a n-p-n HBT and a p-n-p HBT); or relaxing the ~1 ns rise and fall time specification for the photoreceiver output signal.

An array of photoreceivers 10 may also be formed according to the present invention. The photoreceiver array may be used to form digital optical data links (or optical interconnects) with each photoreceiver in the array receiving an incident light beam 100 from an optical transmitter through free space or an optical fiber. In this way, a plurality of channels of optical communication may be established for a parallel transfer of digital data between a plurality of integrated circuits (ICs). This is especially advantageous for interconnect-intensive applications such as multi-chip modules (MCMs) or distributed computers (i.e. parallel computers) which may require that huge amounts of digital data be frequently transferred between ICs. (The photoreceiver 10 also has applications for use in forming optical computers or optical neural networks with one or more input beams 100 being provided to the photodetector and used to trigger an output signal from the photoreceiver.) The individual photoreceivers in the array may be spaced by about 1 mm or less. For an array spacing of about 500 µm, for example, a power consumption for each photoreceiver of about 10–20 mW would correspond to an average heat loading of about 4–8 W/cm$^2$ which may be dissipated through a submount or heat sink to which the substrate 16 may be attached.

The use of such digital optical data links is advantageous in that digital data may be transferred in parallel at a clock rate of the ICs to provide a high rate of data transfer without timing and power consumption penalties associated with data transfer by multiplexing and demultiplexing. To provide parallel data links between IC chips within a MCM, up to about 2000 channels of communication (comprising a transmitter and photoreceiver on different levels within a stacked MCM for a one-way communication channel; or a transmitter and photoreceiver on each level within the stacked MCM for a two-way communication channel) may be required, for example, at a data bit rate of about 100 megabits/second (Mb/s). In forming such large scale parallel digital optical data links, power consumption and heat dissipation by the arrayed transmitters and photoreceivers are important considerations. The power consumption and heat dissipation are preferably balanced between a first substrate containing the arrayed transmitters (e.g. VCSELs or LEDs) and a second substrate (i.e. substrate 16) containing the arrayed photoreceivers 10. In general, for a given data transfer bit rate the provision of a higher optical power by the transmitters in the light beams 100 will result in a larger photocurrent signal in the photoreceiver, requiring less amplification therein and thereby requiring less power consumption in the photoreceiver. Thus, in a balanced 2000 channel digital optical data link, for example, a power budget of about 20 W (determined by both electrical and thermal considerations) may be allotted to each of the transmitter and photoreceiver arrays, thereby requiring that each individual photoreceiver operate with a power consumption of about 10 mW. The low power consumption of 10–20 mW (and preferably 10 mW or less) possible with each individual photoreceiver 10 of the present invention is much smaller than that disclosed in general for prior art photoreceivers (e.g. with cascode amplifiers) used for fiber optic communications.

A further important consideration for digital optical data transfer is that the data being transferred or communicated between ICs must be replicated exactly to provide a high data fidelity required for computers or the like. Since multiple IC chips within each level of a MCM are highly interconnected, any timing delays produced by the optical data transfer should preferably be minimized. Furthermore, a large number of parallel channels of communication for digital optical data transfer may preclude the use of advanced error coding techniques or clock recovery circuits (although the clock signal itself may be transferred as a part of the digital optical data). Thus to accurately replicate digital data transferred at a data bit rate of about 100 Mb/s, a response time of the photoreceiver (i.e. rise and fall times of the photoreceiver output signal) should preferably be no more than about 1–1.5 ns, thereby requiring that the photoreceiver preferably have a bandwidth of about 1 GHz or more.

The photoreceiver 10 should also preferably operate at any clock rate or speed of the CMOS circuitry to which it and an associated optical transmitter are connected, with each channel of communication appearing much like an electrical interconnection between a pair of ICs (except without contacting problems that may be present in spring-loaded electrical contacts between stacked levels of a MCM). Thus, the photoreceiver 10 should preferably provide an amplified output signal at logic levels of the integrated circuitry be able to directly drive any load provided by an input to the circuitry (e.g. a capacitive load of CMOS circuitry).

A computer simulation of the photoreceiver in the example of FIG. 2 shows that a photoreceiver delay between a light beam incident on the p-i-n photodetector 12 (producing an electrical photocurrent signal of about 0.1 mA or more) and an amplified output signal from the photoreceiver may be less than about 1.5 nanoseconds when driving a 4 pF capacitive load (corresponding to a typical input gate of 3.3 volt CMOS circuitry) with a power consumption of about 8 mW for the photoreceiver operating at 100 Mb/s. Additional delays may occur for generating the light beam 100 within an optical transmitter, for transit of the light beam over a predetermined optical path from the transmitter to the photoreceiver, for transit of the photoreceiver output signal over the input connection 112 to the CMOS circuitry, and for activation of the CMOS circuitry to generate a logic state transition therein in response to the photoreceiver output signal.

Figure 3A:
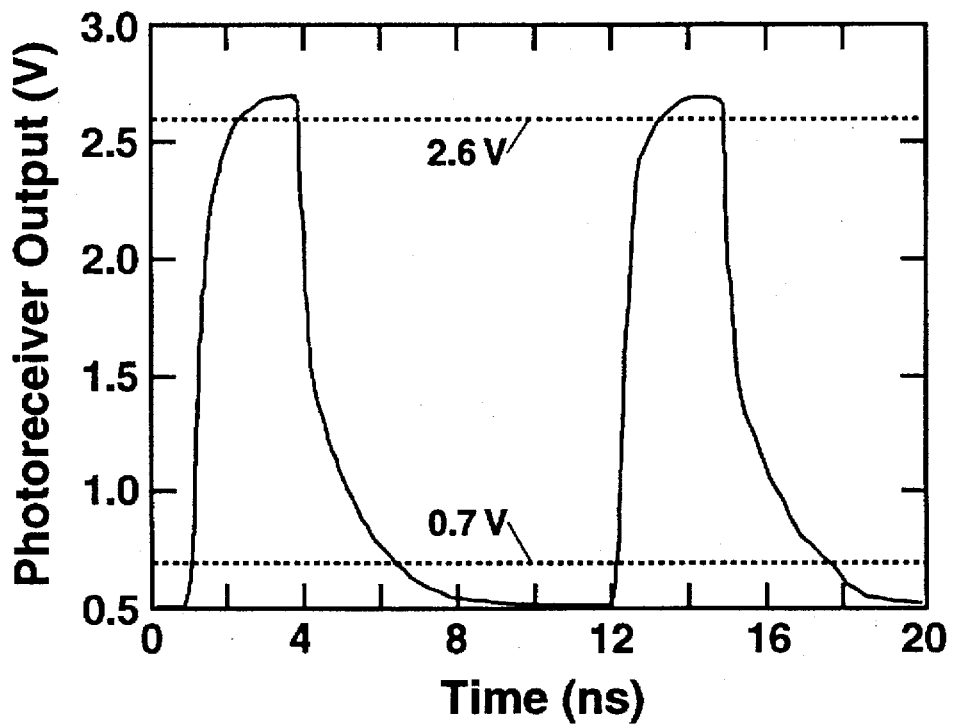
FIGS. 3a and 3b show an amplified output signal from the digital photoreceiver for operation at speeds of about 100 MHz and 400 MHz, respectively.
Figure 3B:
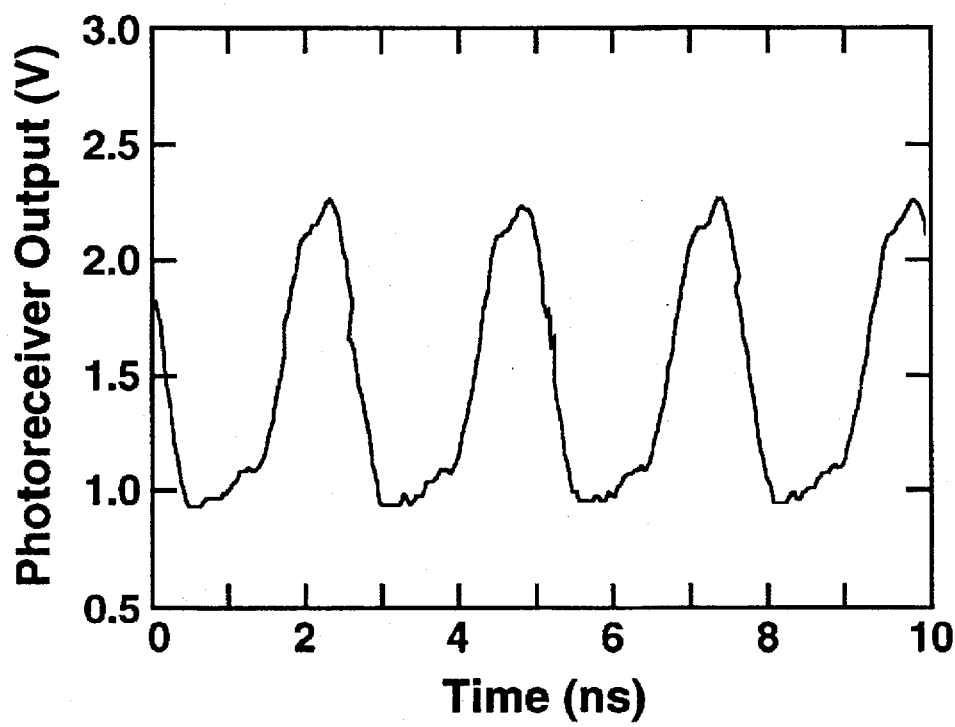

FIGS. 3a and 3b show an amplified output signal from the digital photoreceiver for operation at speeds of about 100 MHz and 400 MHz, respectively. To generate the amplified output signal from the photoreceiver that is shown in FIG. 3a, a diode laser optical transmitter is square-wave modulated to generate a continuous stream of 2 ns light pulses (about 1.25 mW peak pulse power at a wavelength near 980 nm) at a 100 MHz pulse repetition rate for the incident light beam 100. These incident light pulses generate an electrical photocurrent signal within the p-i-n photodetector of about 0.5 mA, with the photocurrent signal being converted by the HBT amplifier into a digital output signal having "high" and "low" logic state levels of about 2.7 and 0.5 volts, respectively. In FIG. 3a, a relatively long fall time of the digital output signal is attributed to a slow decay time of the 980 nm optical transmitter. In FIG. 3a horizontal dotted lines are shown at voltages of 0.7 volts and 2.6 volts to indicate preferred signal levels to obtain low power dissipation in 3.3 volt CMOS circuitry for operation at about 100 Mb/s. Thus, to activate a first logic state (i.e a "low" or logical "0" state) within the CMOS circuitry, the photoreceiver output voltage is preferably 0.7 volts or less; while to activate a second logic state (i.e. a "high" or logical "1" state) within the circuitry, the photoreceiver output voltage is preferably 2.6 volts or more.)

A pulse propagation delay of the photoreceiver was measured to be about 1 ns when driving a 4 pF load, with the delay being substantially independent of the power in the incident light beam for power levels above about −10 dBm (i.e. 0.1 mW). A high degree of optical noise immunity is also present in the photoreceiver circuit design of FIG. 2, with a low electrical noise level being provided by the use of a multi-level interconnect metallization and a dielectric planarization of the photoreceiver. For simulated data transfer (using a a square-wave pattern similar to that of FIG. 3a), a bit error rate of about $10^{-12}$ was measured. Furthermore, measured eye diagrams for the amplified photoreceiver output signal at the simulated 100 Mb/s data transfer rate are open, indicating a high signal-to-noise ratio for transmission of the data.

Although present packaged CMOS circuitry is generally limited to operation at speeds of about 100–200 MHz (due to parasitics arising from packaging and electrical interconnections), the photoreceiver 10 of the present invention can operate at speeds up to about 400 MHz or more with square-wave modulation, thereby simulating an alternating "1" and "0" bit stream at a data rate of 800 Mb/s. (Photoreceivers having a smaller photodetector size are expected to provide for data transfer at rates of about 1000 Mb/s or higher.) At these high speeds, the logic state levels of the amplified photoreceiver output signal are modified slightly, being preferably about 1 volt or less for the "low" logic state and about 2 volts or more for the "high" logic state as shown for data transfer with a 400 MHz alternating "high" and "low" bit pattern in FIG. 3b. For use with CMOS circuitry, the photoreceiver 10 should generally provide an amplified output signal level of less than about one half the power supply voltage (e.g. about 1.4 volts for 3.3 volt CMOS) for triggering or activating a first logic state (i.e. a "low" or "0" state) of the circuitry; whereas an amplified photoreceiver output signal level of greater than about one half the power supply voltage (e.g. about 1.55 volts for 3.3 volt CMOS) is generally required for triggering a second logic state (i.e. a "high" or "1" state) of the circuitry. Thus, the amplified output signal provided by the photoreceiver is capable of directly driving present and future CMOS circuitry (and other integrated circuitry) at operating speeds up to 400 MHz or higher, thereby eliminating a need for any further amplification or signal conditioning by buffers, line drivers, clock recovery circuits, level shifters or the like. This ability to interface directly with CMOS circuitry (and other integrated circuitry) further minimizes any timing delays for digital data transfer and conserves space within a MCM or the like that would otherwise be required for electrical interconnections for transferring the data.

The matter set forth in the foregoing description and accompanying drawings is offered by way of illustration only and not as a limitation. Other applications and variations of the CMOS-compatible InP/InGaAs photoreceiver will become evident to those skilled in the art. For example, although the photoreceiver of the present invention has been described generally for transferring digital optical data between ICs, other embodiments of the present invention may be provided as photoreceivers to provide electrical outputs for optical computers or other types of optical signal processors or correlators. Thus, according to the present invention a photoreceiver may be provided for use in an optical computer, or as a part of an optical neuron (wherein sufficient light intensity must be present on the photodetector from one or more light beams incident thereon before a "high" amplified output signal is provided by the photoreceiver). As another example, one or more photoreceivers formed according to the present invention may be located within a single- or multiple-optical-fiber connector or the like for receiving optical-fiber-coupled light beams and generating output signals therefrom for digital optical data transfer (e.g. computer interconnects) or digital telecommunications. Furthermore, although the photoreceiver has been generally described in terms of CMOS circuitry operating at about 3.3 volts, other embodiments of the present invention may be applied to CMOS circuitry operating at other voltages (e.g. 5 volts, or less than 3.3 volts) and to integrated circuits other than CMOS (e.g. emitter-coupled logic or ECL circuitry). Finally, although the present invention has been described in terms of an InP/InGaAs semiconductor layer structure formed on an InP substrate, the teaching of the present invention is also applicable to other semiconductor layer structures formed on other semiconductor substrates (e.g. a GaAs/AlGaAs layer structure on a GaAs substrate for forming a digital photoreceiver for detecting an incident light beam at a wavelength less than about 0.95 μm). The actual scope of the invention is intended to be defined in the following claims when viewed in their proper perspective based on the prior art.

What is claimed is:

1. A monolithic digital photoreceiver comprising:
   (a) a substrate having a plurality of semiconductor layers epitaxially grown thereon;
   (b) a photodetector formed within the plurality of semiconductor layers for receiving at least one incident light beam with digital data impressed thereon and generating a photocurrent signal; and
   (c) a switching amplifier formed within the plurality of semiconductor layers proximate to the photodetector for receiving the photocurrent signal and recovering the digital data.

2. The photoreceiver of claim 1 wherein the substrate comprises InP, and the semiconductor layers are InP/InGaAs layers.

3. The photoreceiver of claim 1 wherein the photodetector is a p-i-n photodetector.

4. The photoreceiver of claim 1 wherein the photodetector is a metal-semiconductor-metal (MSM) photodetector.

5. The photoreceiver of claim 1 wherein the switching amplifier includes an output stage comprising switching transistors.

6. The photoreceiver of claim 5 wherein the switching transistors are heterojunction bipolar transistors (HBTs).

7. The photoreceiver of claim 6 wherein the HBT switching transistors form a complimentary pair.

8. The photoreceiver of claim 1 wherein the recovered digital data has logic levels sufficient for directly driving an integrated circuit (IC) to which the photoreceiver is electrically connected.

9. The photoreceiver of claim 8 wherein the integrated circuit is a complementary metal-oxide-semiconductor (CMOS) integrated circuit.

10. The photoreceiver of claim 8 wherein the photoreceiver operates at a single power supply voltage of the IC.

11. The photoreceiver of claim 10 wherein the single power supply voltage is less than about 5 volts.

12. The photoreceiver of claim 1 wherein the switching amplifier drives a substantially capacitive load presented by at least one input gate of an integrated circuit to which the photoreceiver is electrically connected.

13. The photoreceiver of claim 12 wherein the load is about 4 picoFarads (pF) for each input gate.

14. The photoreceiver of claim 1 wherein the switching amplifier drives a load of about 50 Ω.

15. The photoreceiver of claim 1 further including a lens formed below the substrate for focusing the incident light beam through the substrate and into the photodetector.

16. The photoreceiver of claim 1 wherein the incident light beam has a wavelength in the range of about 0.95–1.6 μm.

17. The photoreceiver of claim 1 wherein digital data impressed on the incident light beam has a bit rate of about 50–1000 megabits/second (Mb/s).

18. The photoreceiver of claim 1 having a power consumption of less than about 20 mW.

19. The photoreceiver of claim 1 which in combination with an optical transmitter that generates the incident light beam defines a channel of digital optical communications between integrated circuits.

20. An array of monolithic digital photoreceivers formed according to claim 1 on the substrate, with each photoreceiver receiving a separate light beam and recovering digital data therefrom.

21. The array of photoreceivers of claim 20 wherein adjacent photoreceivers are spaced by less than about 1 mm.

22. The array of photoreceivers of claim 20 wherein each photoreceiver has a power consumption of less than about 20 mW.

23. The array of photoreceivers of claim 20 wherein each photoreceiver recovers digital data at a bit rate between about 50 and 1000 Mb/s from the light beam incident thereon.

24. The array of photoreceivers of claim 23 wherein each photoreceiver in combination with an optical transmitter that generates the incident light beam defines a channel of digital optical communications between integrated circuits.

25. The array of photoreceivers of claim 24 wherein the integrated circuits are located on different levels of a stacked multi-chip module (MCM), with each channel of digital optical communications being directed at least in part through free space between different levels of the MCM.

26. The array of photoreceivers of claim 25 wherein the integrated circuits are CMOS integrated circuits.

27. A monolithic CMOS-compatible digital photoreceiver comprising:
   (a) an InP substrate having a plurality of InP/InGaAs semiconductor layers grown thereon;
   (b) a p-i-n photodetector formed within the plurality of semiconductor layers for receiving at least one incident light beam with digital data impressed thereon and generating an electrical photocurrent signal; and
   (c) a heterojunction bipolar transistor (HBT) amplifier formed within the plurality of semiconductor layers proximate to the photodetector for receiving the electrical photocurrent signal and generating therefrom an amplified output signal that replicates the digital data and directly drives CMOS circuitry to which the photoreceiver is connected.

28. The photoreceiver of claim 27 further including a lens formed below the substrate for focusing each incident light through the substrate and into the photodetector.

29. The photoreceiver of claim 27 wherein the amplified output signal provides signal levels of less than about one-half of a CMOS power supply voltage for activating a first logic state of the CMOS circuitry and more than about one-half of the CMOS power supply voltage for activating a second logic state of the CMOS circuitry.

30. The photoreceiver of claim 29 wherein the CMOS power supply voltage is about 3.3 volts, and the signal levels are about 1.4 volts for the first logic state and about 1.55 volts for the second logic state.

31. The photoreceiver of claim 27 wherein the amplifier includes an output stage comprising a pair of switching transistors for directly switching a load provided by at least one input gate of the CMOS circuitry between a first logic state and a second logic state.

32. The photoreceiver of claim 31 wherein the switching transistors form a complementary pair.

33. The photoreceiver of claim 31 wherein the load provided by each input gate is a capacitive load of about 4 pF.

34. The photoreceiver of claim 31 wherein the load is about 50 Ω.

35. The photoreceiver of claim 27 having a power consumption of less than about 20 mW.

36. The photoreceiver of claim 27 wherein each incident light beam has a wavelength in the range of about 0.95–1.6 μm.

37. The photoreceiver of claim 27 wherein the digital data impressed upon each incident light beam has a bit rate of about 50–1000 Mb/s.

38. An array of monolithic CMOS-compatible digital photoreceivers formed according to claim 27 on the substrate with each photoreceiver receiving a separate incident light beam and recovering digital data therefrom.

39. The array of photoreceivers of claim 38 wherein adjacent photoreceivers are spaced by less than about 1 mm.

40. The array of photoreceivers of claim 38 wherein each photoreceiver has a power consumption of less than about 20 mW.

41. The array of photoreceivers of claim 38 wherein each photoreceiver recovers digital data at a bit rate between about 50 and 1000 Mb/s from the light beam incident thereon.

42. The array of photoreceivers of claim 38 wherein each photoreceiver in combination with an optical transmitter that generates the incident light beam defines a channel of digital optical communications between CMOS circuits.

43. The array of photoreceivers of claim 42 wherein the CMOS integrated circuits are located on different levels of a stacked MCM, with each channel of digital optical communications being directed at least in part through free space between different levels of the MCM.

44. A monolithic CMOS-compatible photoreceiver comprising:
   (a) an InP substrate having a plurality of InP/InGaAs semiconductor layers grown thereon;
   (b) a p-i-n photodetector formed from the semiconductor layers for detecting an incident light beam and generating therefrom an electrical photocurrent signal;
   (c) a heterojunction bipolar transistor (HBT) amplifier formed from the semiconductor layers for receiving the photocurrent signal and generating therefrom an amplified signal having signal levels sufficient for directly driving CMOS circuitry; and
   (d) a single CMOS power supply providing a voltage for biasing the photoreceiver and powering the amplifier.

45. The photoreceiver of claim 44 wherein the amplifier includes an output stage comprising a pair of switching output transistors for driving a substantially capacitive load presented by the CMOS circuitry.

46. The photoreceiver of claim 45 wherein the switching transistors form a complementary pair.

47. The photoreceiver of claim 44 wherein the incident light beam has a wavelength in the range of about 0.95–1.6 μm.

48. A plurality of photoreceivers according to claim 44 in the form of an array.

* * * * *